United States Patent
Bolte et al.

(10) Patent No.: US 9,389,257 B2
(45) Date of Patent: Jul. 12, 2016

(54) METHOD FOR PRODUCING A CAPACITIVE CONTACT SENSOR AND CAPACITIVE CONTACT SENSOR

(75) Inventors: Peter Bolte, Buseck (DE); Till Fiegler, Butzbach/Maibach (DE)

(73) Assignee: Continental Automotive GmbH, Hannover (DE)

( * ) Notice: Subject to any disclaimer, the term of this patent is extended or adjusted under 35 U.S.C. 154(b) by 664 days.

(21) Appl. No.: 13/813,133

(22) PCT Filed: Jul. 19, 2011

(86) PCT No.: PCT/EP2011/062367
§ 371 (c)(1),
(2), (4) Date: Mar. 25, 2013

(87) PCT Pub. No.: WO2012/013545
PCT Pub. Date: Feb. 2, 2012

(65) Prior Publication Data
US 2014/0145731 A1   May 29, 2014

(30) Foreign Application Priority Data
Jul. 30, 2010   (DE) .......................... 10 2010 032 951

(51) Int. Cl.
*G09G 5/00*      (2006.01)
*G01R 27/26*   (2006.01)
(Continued)

(52) U.S. Cl.
CPC .............. *G01R 27/2605* (2013.01); *G01R 3/00* (2013.01); *H03K 17/9622* (2013.01); *B60K 2350/1036* (2013.01); *H03K 2217/960755* (2013.01)

(58) Field of Classification Search
CPC .......... G06F 3/044; G06F 2203/04103; G01R 27/2605; G01R 3/00; B60K 2350/1036; H03K 2217/960755; B32B 37/12
USPC ................................... 345/173–178; 324/661
See application file for complete search history.

(56) References Cited

U.S. PATENT DOCUMENTS
2003/0122794 A1   7/2003   Caldwell
2007/0031161 A1   2/2007   Iandoli et al.
(Continued)

FOREIGN PATENT DOCUMENTS
CN   101178630   5/2008
CN   101607431   12/2009
DE   43 36 820 A1   5/1995
DE   10 2007 035 455 A1   2/2009
(Continued)

OTHER PUBLICATIONS
"Kratzfest in einem Schritt", Sven Schröbel u. a.; Carl Hanser Verlag, München; Kunststoffe Jan. 2010; pp. 52-55; (www.kunststoffe.de, documents-No. KU110297) (Own Search).
(Continued)

*Primary Examiner* — Jennifer Nguyen
(74) *Attorney, Agent, or Firm* — Cozen O'Connor (57) ABSTRACT

A method for producing a capacitive contact sensor and a capacitive contact sensor having a carrier plate made of plastic are described. The front surface of the sensor initiates a switching process when contacted, and the rear surface of the sensor has one or more capacitive sensor electrodes disposed thereon and connected via conductors to analysis electronics. The regions on the front surface of the carrier plate opposite the sensor electrodes thereby form contact zones. A plastic film supporting the sensor electrodes and conductors is placed on a first side wall of a cavity of an injection molding tool, wherein the sensor electrodes face the first side wall, and then a polycarbonate forming the carrier plate is injected into the cavity on the side of the plastic film facing away from the sensor electrodes. The cavity is then expanded, forming a gap on the side facing away from the plastic film and the gap is injected with a further plastic reacting with the polycarbonate in the contact region and forming a scratchproof coating.

12 Claims, 7 Drawing Sheets

(51) Int. Cl.
*H03K 17/96* (2006.01)
*G01R 3/00* (2006.01)

(56) References Cited

U.S. PATENT DOCUMENTS

| | | | | |
|---|---|---|---|---|
| 2008/0257706 | A1* | 10/2008 | Haag | B29C 45/14655 200/600 |
| 2009/0027356 | A1 | 1/2009 | Heimann et al. | |
| 2009/0317648 | A1* | 12/2009 | Kong | B29C 45/1635 428/515 |
| 2010/0013499 | A1 | 1/2010 | Tong et al. | |

FOREIGN PATENT DOCUMENTS

| | | |
|---|---|---|
| DE | 10 2007 037 680 A1 | 2/2009 |
| DE | 10 2008 016 284 A1 | 10/2009 |
| WO | WO 03/044957 A2 | 5/2003 |

OTHER PUBLICATIONS

"Neues Verfahren integriert RIM-Technologie in Spritzgießprozess", Dorothee Quitter, Article dated Sep. 11, 2007, pp. 1-3; (http://www.konstruktionspraxis.vogel.de/themen/werkstoffe/kunststoff/articles/11420/) (Own Search).

* cited by examiner

Fig.1

METHOD FOR PRODUCING A CAPACITIVE CONTACT SENSOR AND CAPACITIVE CONTACT SENSOR

PRIORITY CLAIM

This is a U.S. national stage of PCT International Application No. PCT/EP2011/062367, filed on 19 Jul. 2011, which claims priority to German Application No. 10 2010 032 951.7, filed 30 Jul. 2010, the contents of which are incorporated herein by reference in its entirety.

BACKGROUND OF THE INVENTION

1. Field of the Invention

The invention relates to a method for producing a capacitive contact sensor having a carrier plate consisting of plastic, a switching process being initiatable by touching the front surface thereof, and one or more capacitive sensor electrodes which are connected via conductor tracks to evaluation electronics being arranged on its rear surface, the regions on the front surface of the carrier plate which lie opposite the sensor electrodes forming contact zones.

2. Description of the Related Art

In the case of capacitive contact sensors, it is known to produce the carrier plate by injection molding, to provide the front side with a varnish and to adhesively bond capacitive sensor electrodes onto the rear side.

The production of these contact sensors elaborately requires a plurality of joining and mounting processes, in order to connect individual components to one another.

SUMMARY OF THE INVENTION

It is therefore an object of the invention to provide a method for producing a capacitive contact sensor and a capacitive contact sensor, a simply constructed contact sensor of high quality being producible in a simple production process.

This object is achieved according to the invention in that a plastic film carrying the sensor electrodes and conductor tracks is placed onto a first side wall of a cavity of an injection molding tool with the sensor electrodes directed toward the first side wall, and then a polycarbonate (PC) forming the carrier plate is injected into the cavity on the side of the plastic film facing away from the sensor electrodes. That the cavity is then widened to form a gap on the side facing away from the film, and the gap is injected with a further plastic which reacts with the polycarbonate (PC) in the contact region and forms a scratchproof coating. Alternatively, the component consisting of the plastic film and the carrier plate is removed from the cavity and placed into a second cavity, a gap then being formed in the second cavity on the side facing away from the plastic film, which gap is injected with a further plastic which reacts with the polycarbonate in the contact region and forms a scratchproof coating.

Another solution to the object consists in that a plastic film carrying the sensor electrodes and conductor tracks is placed onto a first side wall of a cavity of an injection molding tool with the sensor electrodes directed toward the first side wall. The plastic film is provided with an adhesion promoter layer on its side facing away from the sensor electrodes. A polymethyl methacrylate (PMMA) forming the carrier plate is then injected into the cavity on the side of the plastic film facing away from the sensor electrodes. The that the cavity is then widened to form a gap on the side facing away from the plastic film and the gap is injected with a further plastic which connects with a material fit to the polymethyl methacrylate (PMMA) in the contact region and forms a scratchproof coating. Alternatively, the component consisting of the plastic film and the carrier plate is removed from the cavity and placed into a second cavity; a gap then is formed in the second cavity on the side facing away from the plastic film, which is injected with a further plastic which connects with a material fit to the polymethyl methacrylate of the carrier plate in the contact region and forms a scratchproof coating.

By the injection of the carrier plate onto the plastic film, connection of the sensor electrodes to the carrier plate takes place simultaneously without a separate mounting process.

The plastic film not only forms a carrier which is easy to handle for exact placement of the sensor electrodes in the cavity, but in a double function protects the sensor electrodes from damage and displacement of their position in the cavity due to the carrier plate plastic injected with high pressure into the cavity.

In one of the embodiments, the application of the scratchproof coating takes place without removal of the carrier plate from the cavity, taking place merely by widening and injecting the latter.

The high hot-forming stability of the plastic of the carrier plate leads to a high dimensional retention of the contact sensor, since substantially no distortion takes place. Reprocessing can therefore be obviated.

At the same time, the carrier plate consisting of PC does not splinter, so that the contact sensor can be used as a control panel even in the head impact region in the motor vehicle.

In the case of the carrier plate consisting of PMMA, it has surprisingly been found that the per se poor fracture properties of PMMA can be improved significantly by the adhesion promoter layer, so that in this case as well the contact sensor can be used as a control panel even in the head impact region in the motor vehicle.

Since separate handling of parts between individual production steps is obviated, a risk of contamination and damage of the components due to transport and intermediate storage is also minimized, which implies a quality improvement.

Good connection of the plastic film and the carrier plate is achieved when the plastic film is a polycarbonate film.

If the further plastic which forms the scratchproof coating is a polymethyl methacrylate (PMMA), then it also has chemical stability in addition to being scratchproof.

By the reaction of the PMMA with the polycarbonate by means of a reactive system, in a similar way to a 2-component adhesive, a solid connection between these two materials takes place after the reaction, substantially forming a thermoset.

If the second side wall of the cavity, lying opposite the first side wall of the cavity, is fully or locally provided with a surface structure, the actuation surface of the contact sensor can be provided with a corresponding surface structure without any additional outlay.

In this way, for example, a degree of gloss fully covering the actuation surface, or partially different degrees of gloss of the actuation surface, can be produced without any special outlay.

To this end, the surface structure may be an eroded structure or an etched structure.

It is, however, also possible for the surface structure to be a nanostructure comprising protrusions smaller than the wavelength of light.

This straightforwardly leads with the production process of the carrier plate to a reflection-reducing surface which can furthermore produce easy cleanability ("easy to clean") or even low visibility of fingerprints ("anti-fingerprint").

If the second side wall of the cavity, lying opposite the first side wall of the cavity, comprises one or more depressed or elevated regions, then elevations and depressions which can be used as tactile aids or haptic elements can be produced on the actuation surface of the contact sensor.

A depression, an elevation or a region enclosed by elevations may be the region of a contact zone.

The plastic film may be a transparent plastic film, so that the contact sensor can be illuminated through transmissively.

Decorative properties are imparted to the contact sensor if the plastic film and/or the carrier plate are colored.

Furthermore, signs and/or symbols and/or ornaments may be arranged on the side of the plastic film facing the first side wall, and the carrier plate may be produced by a transparent PC.

By the plastic film, the signs, symbols and ornaments, which may be printed, are protected from being washed away and damaged by the plastic of the carrier plate when the latter is injected into the cavity.

Illumination through the contact sensor is not impaired if the sensor electrodes are transparent sensor electrodes.

A degree of spatial configuration freedom is achieved without extra outlay if the first side wall and/or the second side wall of the cavity has a spatially curved shape and/or regions spatially deviating from a plane.

In this case, the plastic film is preferably a deep-drawn plastic film having a shape adapted to the first side wall.

The advantages of the features of claims 1 to 13 also apply accordingly for the capacitive contact sensor having the features of claims 14 to 19.

If evaluation electronics are arranged on the side of the plastic film carrying the sensor electrodes and conductor tracks, then the plastic film also fulfills the function of a carrier component for the evaluation electronics in addition to the functions already mentioned.

DETAILED DESCRIPTION OF THE PREFERRED EMBODIMENTS

The capacitive contact sensors represented in the Figures have a plastic film 1 consisting of transparent polycarbonate (PC), on the lower side of which capacitive sensor electrodes (not represented) are applied.

A plate 2 of a transparent or opaque polycarbonate (PC) is injected in an injection molding method onto the upper side of the plastic film 1, facing away from the sensor electrodes.

A transparent scratchproof coating 3 of polymethyl methacrylate (PMMA), which reacts with the polycarbonate and has a thickness approximately between 15 µm and 280 µm, is injected onto the polycarbonate (PC) of the plate 2 on the side opposite the plastic film 1.

The plate 2 and the coating 3 form a carrier plate 4, 4', 4", 4''', 4''''.

Corresponding with the sensor electrodes, contact zones 5, 5', 5" are formed as sensitive regions on the front surface 7 of the carrier plate 2.

A switching function is initiated by a sufficiently large conductive body, for example a human finger, being brought in proximity to a contact zone 5, 5', 5" and therefore in proximity to the sensor electrode assigned to the contact zone 5, 5', 5".

The switching signal generated is delivered via conductor tracks (not represented) arranged on the plastic film 1 to evaluation electronics.

To this end, the plastic film 1 extends with a flexible connection 6 beyond the carrier plate 4, 4', 4", 4''', 4'''' and leads to a printed circuit board (not represented) carrying the evaluation electronics.

In the exemplary embodiments of FIGS. 1 to 7, there are both contact zones 5 with a planar front surface 7 of the carrier plate 4 and contact zones 5' formed as depressions 8 on the front surface 7.

Figure 1:
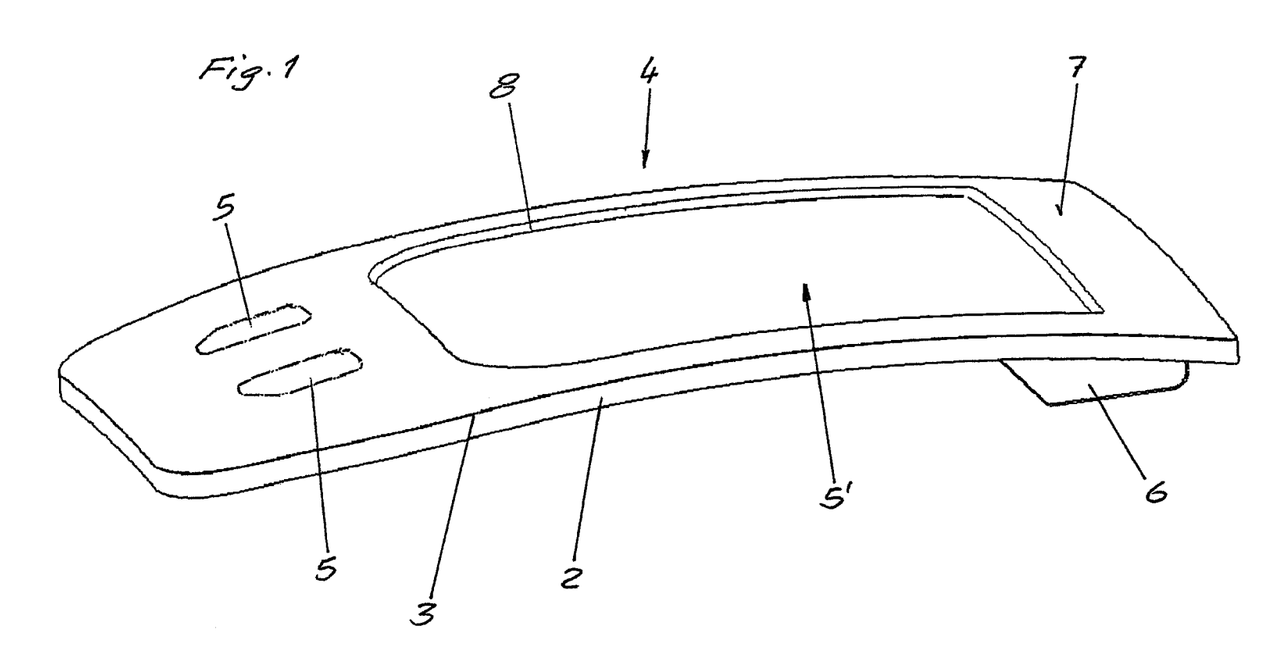
FIG. 1 shows a perspective front view of a first exemplary embodiment of a capacitive contact sensor.
Figure 2:
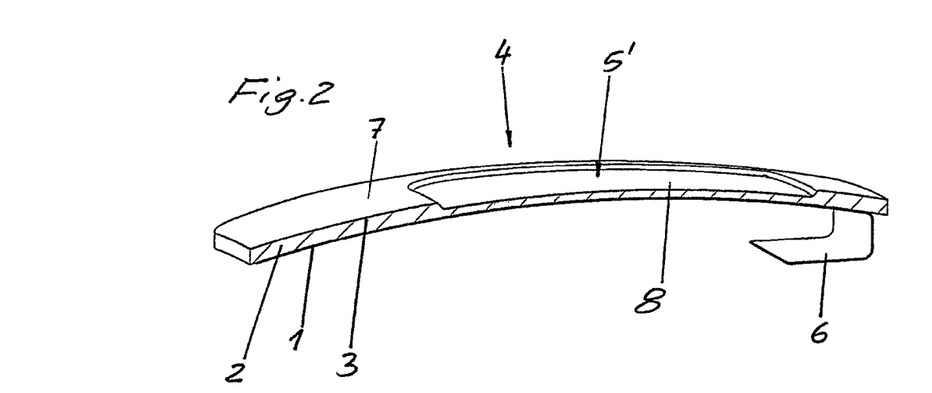
FIG. 2 shows a longitudinal section through the contact sensor according to FIG. 1.
Figure 3:
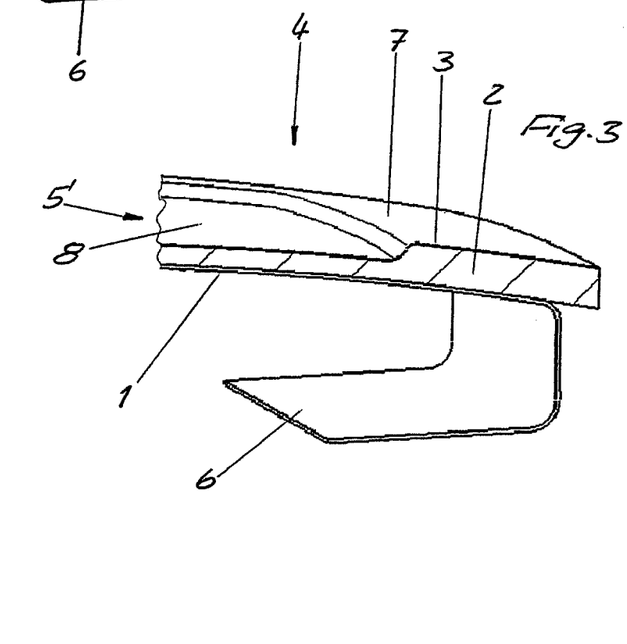
FIG. 3 shows an enlarged detail of the contact sensor according to FIG. 1.
Figure 4:
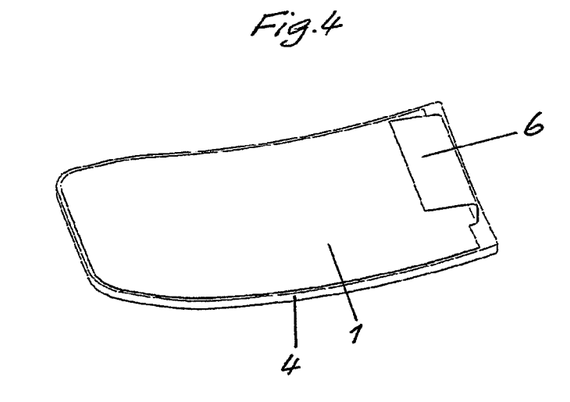
FIG. 4 shows a perspective view from below of the contact sensor according to FIG. 1.
Figure 5:
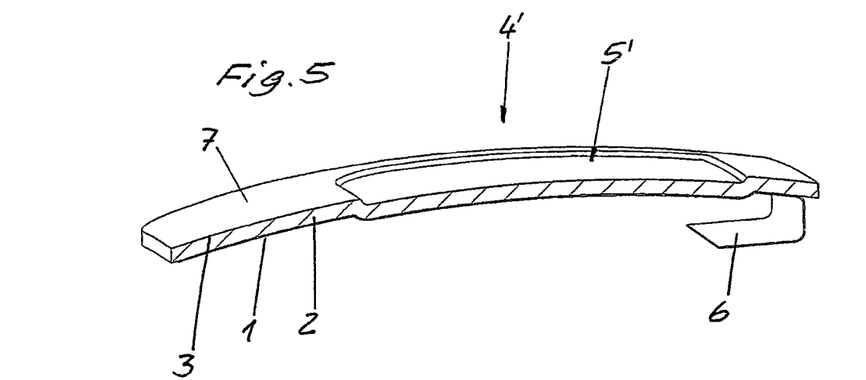
FIG. 5 shows a longitudinal section of a perspective front view of a second exemplary embodiment of a capacitive contact sensor.
Figure 6:
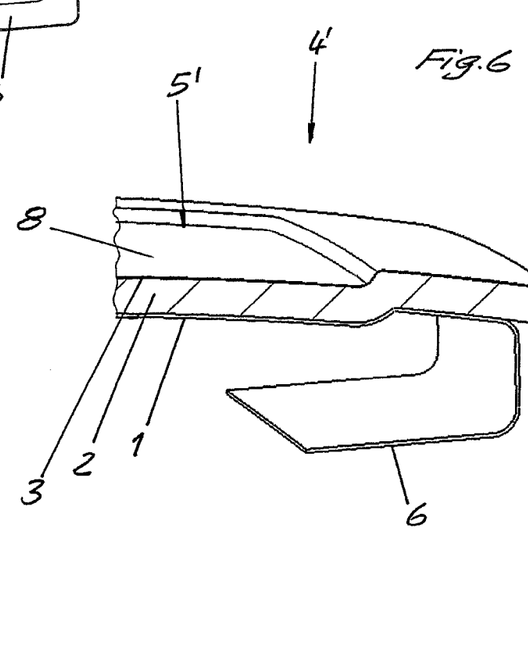
FIG. 6 shows an enlarged detail of the contact sensor according to FIG. 5.
Figure 7:
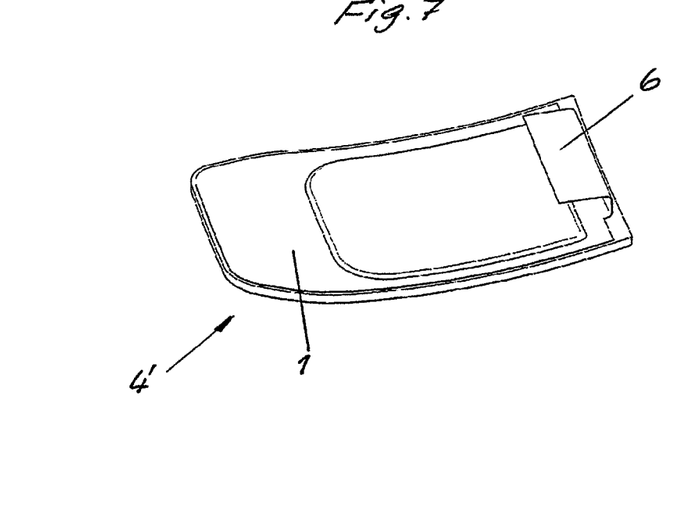
FIG. 7 shows a perspective view from below of the contact sensor according to FIG. 5.

In FIGS. 1 to 3, the carrier plate 4 has a constant thickness apart from the depression 8.

In FIGS. 4 to 7, the carrier plate 4' and the plastic film 1 are adapted to the depression 8, so that the carrier plate 4', 4 as a constant thickness without exception.

Figure 8:
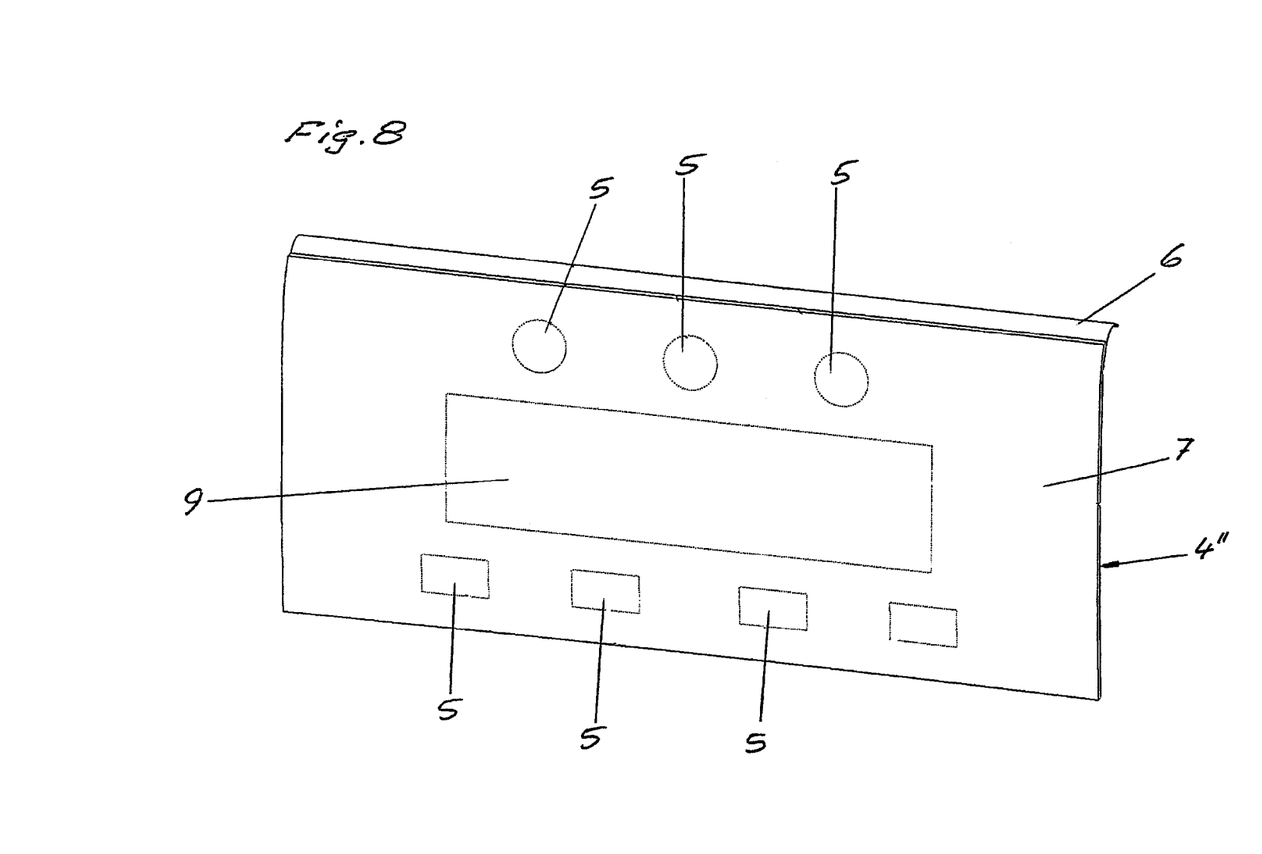
FIG. 8 shows a perspective front view of a third exemplary embodiment of a capacitive contact sensor.

The exemplary embodiment of FIG. 8 has a carrier plate 4" with a planar front surface 7, on which two rows of contact zones 5 are represented by a thin line.

Between the two rows of contact zones 5, a display region 9 is denoted likewise by a thin line.

Since the plastic film 1 and the carrier plate 4" are transparent, it is possible for symbols, signs and ornaments printed on the plastic film 1 to be seen on the front side of the contact sensor, which may be illuminated through transmissively.

It is however also possible to arrange a display, which is in particular a display which can be illuminated through transmissively, in the display region behind the carrier plate 4".

Figure 9:
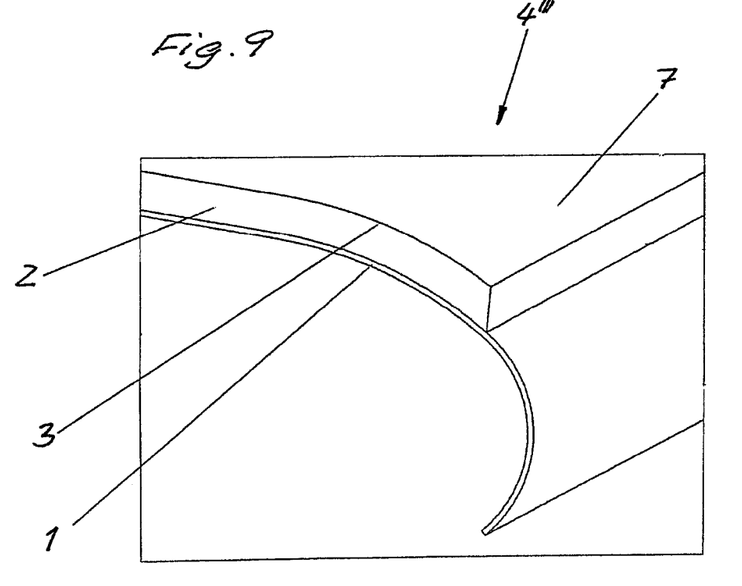
FIG. 9 shows an enlarged detail of a perspective side view of a fourth exemplary embodiment of a capacitive contact sensor.
Figure 10:
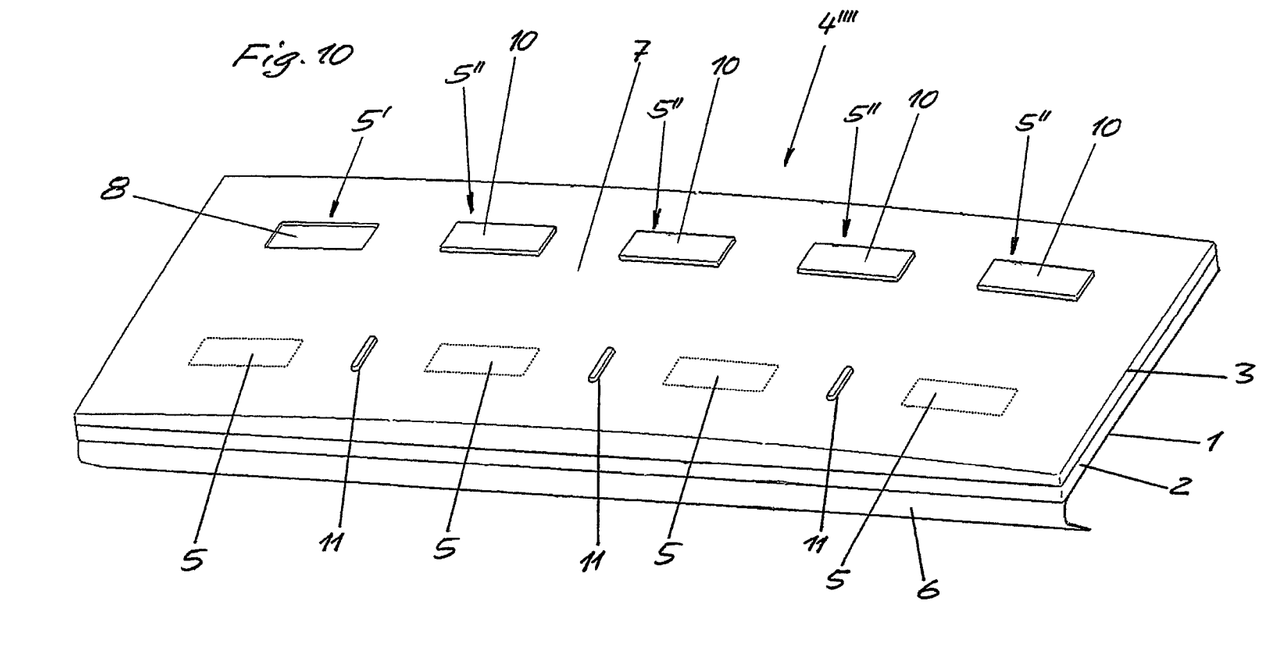
FIG. 10 shows a perspective front view of a fifth exemplary embodiment of a capacitive contact sensor.
Figure 11:
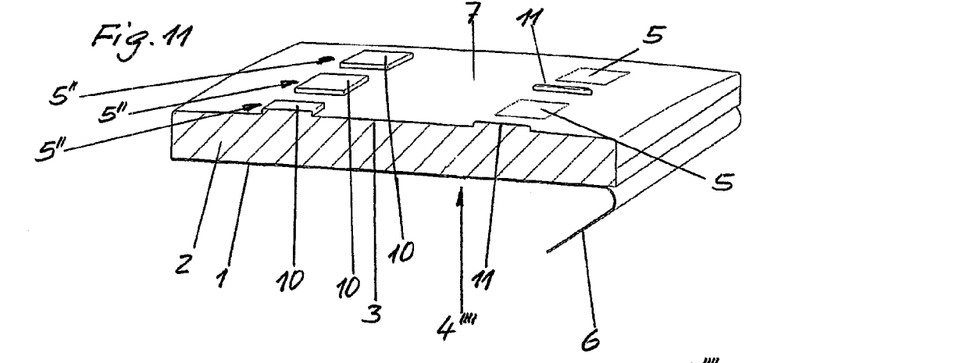
FIG. 11 shows a perspective front view of a sixth exemplary embodiment of a capacitive contact sensor.
Figure 12:
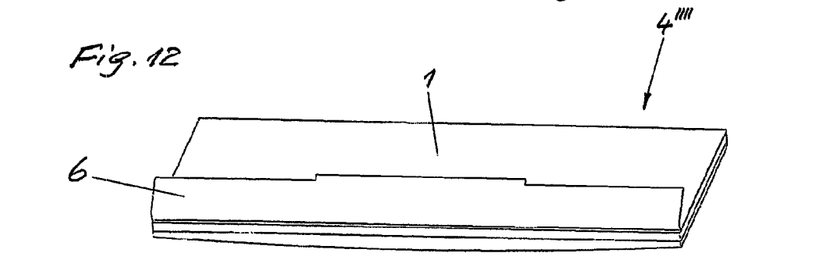
FIG. 12 shows a perspective view from below of the contact sensor according to FIG. 11.
Figure 13:
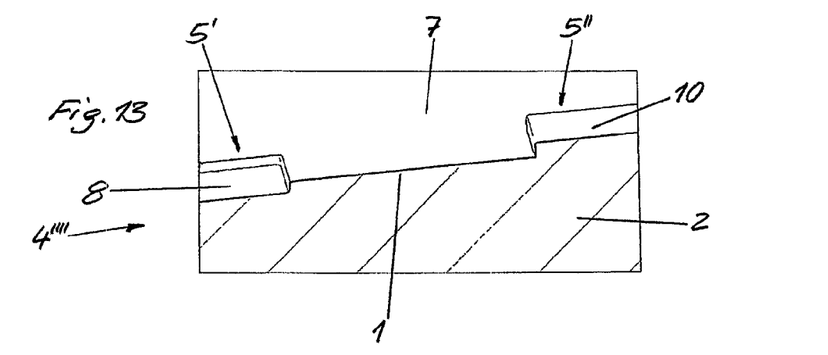
FIG. 13 shows a first enlarged detail of FIG. 11.
Figure 14:
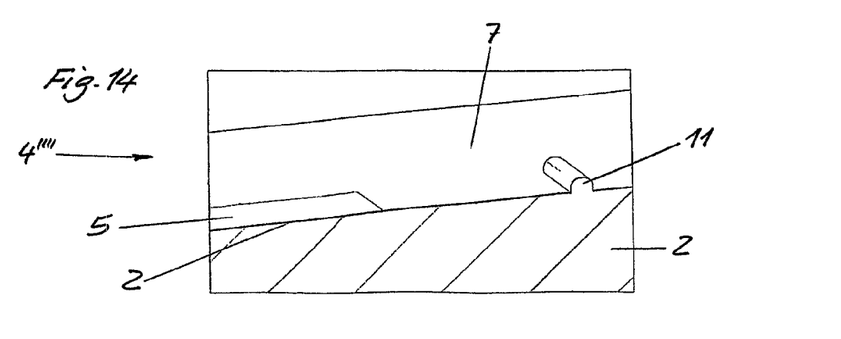
FIG. 14 shows a second enlarged detail of FIG. 11.

In the exemplary embodiment represented in FIG. 9, the coating 3 of the carrier plate 4''' is provided on the front surface 7 with a nanostructure, which is not represented in the representation owing to the fineness of the structure.

This nanostructure is used to reduce reflection and optionally even for the anti-fingerprint property of the front surface 7.

The exemplary embodiment of FIGS. 10 to 14 shows a carrier plate 4'''' which, in the front surface 7, has a depression 8 in a contact zone 5', a row of contact zones 5 having a planar front surface 7 and a further row with button-like elevations 10 in the region of contact zones 5".

Between the contact zones 5 having a planar front surface 7, separating beads 11 embossed as tactile aids are formed protruding from the front surface 7.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method for producing a capacitive contact sensor having:
   a carrier plate made of plastic, a switching process being initiatable by touching a front surface thereof, the capacitive contact sensor further including at least one capacitive sensor electrode arranged on a rear surface of the carrier plate and capable of connection via conductor tracks to evaluation electronics, a region on the front surface of the carrier plate which lies opposite the at least one sensor electrode forming a contact zone, the method comprising:
   placing a plastic film carrying the at least one sensor electrode and the conductor tracks onto a first side wall of a first cavity of an injection molding tool, with the at least one sensor electrode directed toward the first side wall;
   injecting one selected from the group consisting of a polymethyl methacrylate and a polycarbonate for forming the carrier plate into the first cavity on a side of the plastic film facing away from the at least one sensor electrode; and
   performing one selected from the group consisting of the following steps (a) and (b):
   (a) widening the first cavity to form a first gap on a side facing away from the plastic film and, after the widening, injecting the first gap with a further plastic that reacts with the polycarbonate in the contact zone or connects with a material fit to the polymethyl methacrylate to form a scratchproof coating, and
   (b) removing a component consisting of the plastic film and the carrier plate from the first cavity and placing the component into a second cavity, wherein a second gap is formed in the second cavity on a side facing away from the plastic film, the second gap being injected with the further plastic.

2. The method as claimed in claim 1, wherein the plastic film is a polycarbonate film.

3. The method as claimed in claim 1, wherein the further plastic which forms the scratchproof coating is polymethyl methacrylate.

4. The method as claimed in claim 1, wherein a second side wall of the first cavity, lying opposite the first side wall of the first cavity, is fully or locally provided with a surface structure.

5. The method as claimed in claim 4, wherein the surface structure is an eroded structure or an etched structure.

6. The method as claimed in claim 4, wherein the surface structure is a nanostructure comprising protrusions smaller than a wavelength of light.

7. The method as claimed in claim 4, wherein at least one selected from the group consisting of the first side wall and the second side wall of the first cavity has a spatially curved shape and regions spatially deviating from a plane.

8. The method as claimed in claim 7, wherein the plastic film is a deep-drawn plastic film having a shape adapted to the first side wall.

9. The method as wherein claimed in claim 1, wherein a second side wall of the first cavity, lying opposite the first side wall of the first cavity, comprises at least one depressed region.

10. The method as claimed in claim 1, wherein the plastic film is a transparent plastic film.

11. The method as claimed in claim 10, further comprising arranging at least one selected from the group consisting of signs, symbols, and ornaments on a side of the plastic film facing the first side wall, and the polycarbonate for producing the carrier plate is transparent.

12. The method as claimed in claim 1, wherein the at least one sensor electrode includes a transparent sensor electrode.

* * * * *